(12) United States Patent
Ferreri et al.

(10) Patent No.: US 6,823,300 B1
(45) Date of Patent: Nov. 23, 2004

(54) MEMORY EFFICIENT OCCURRENCE MODEL DESIGN FOR VLSI CAD

(75) Inventors: Richard Anthony Ferreri, Ft. Collins, CO (US); Lanzhong Wang, Ft Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 774 days.

(21) Appl. No.: 09/709,695

(22) Filed: Nov. 10, 2000

(51) Int. Cl.[7] .............................................. G06F 17/50
(52) U.S. Cl. ............................ 703/15; 703/14; 703/16
(58) Field of Search ............................. 703/15, 13, 14; 716/18; 203/16

(56) References Cited

U.S. PATENT DOCUMENTS

| 5,870,308 | A | * | 2/1999 | Dangelo et al. | .............. 716/18 |
| 6,009,250 | A | | 12/1999 | Ho et al. | |
| 6,063,128 | A | * | 5/2000 | Bentley et al. | ................ 703/6 |
| 6,173,276 | B1 | * | 1/2001 | Kant et al. | ..................... 706/50 |
| 6,539,536 | B1 | * | 3/2003 | Singh et al. | .................. 716/18 |

FOREIGN PATENT DOCUMENTS

EP 0 213 670 8/1986

OTHER PUBLICATIONS

"An Integral Data Model for Hierarchial Design Assembly, Implementation Considerations," http://www.si2.org/CHD-Std/infomodel/idm.infomodel_implementation.html, pp. 1–4, (Jul. 16, 2002).

"An Integrated Data Model for Hierarchial Design Assembly," http://www.si2.org/CHDStd/infomodel/idm.infomodel_overview.html, pp. 1–4, (Jul. 16, 2002).

UK Search Report for Application No. GB 0126796.2 date Jul. 16, 2002.

* cited by examiner

*Primary Examiner*—Albert W. Paladini

(57) ABSTRACT

The inventive lightweight occurrence model uses a folded connectivity model which includes occurrence nodes. Each occurrence node includes occurrence specific data or a pointer to such data, a pointer to a parent occurrence node, and a pointer to a folded model describer. Thus, the information that would present in a full occurrence model can be included in the inventive lightweight occurrence model. The inventive model does not maintain duplicate information and requires less memory to store the inventive model. Since the inventive occurrence model is smaller than the full occurrence model, complex circuit designs, e.g. microprocessors, can be represented by the inventive lightweight occurrence model. Thus, low level characteristics of the design, e.g., timing delays, can be examined.

27 Claims, 6 Drawing Sheets

MEMORY EFFICIENT OCCURRENCE MODEL DESIGN FOR VLSI CAD

TECHNICAL FIELD

This application is related in general to VLSI CAD design, and in specific to an apparatus and method for representing designs in an occurrence model that eliminates duplicate data about the system thereby reducing the memory usage for the design.

BACKGROUND

Prior computer aided design (CAD) systems represent designs in a hierarchical connectivity form that provides design information to system designers with different levels of abstraction. An example of such a schematic configuration 100 is shown in FIG. 1, which depicts the relationships between a cell 101, a port 102, a net 103, an instance 104, and a port instance 105. Such a configuration is known as a folded connectivity model. The cell block 101 describes a device or structure of the system, e.g. a full adder. A cell contains collections of instances of other cells, nets (which are wires) and the external interfaces to the cell (ports). The net block 103 describes the wires that make up the internal connections within the cell block. The port block 102 describes the interface to the cell and provides the connection points for the nets (wires) to carry signals into and out of the cell block's logic.

As stated above, a cell block provides the definition of a device or structure. Once a cell has been defined, it can then be instantiated (wherein an instance block 104 is created of that cell), so that it may be used in other cell definitions. In this way, a design hierarchy can be created. The instance block describes the devices or structures used to form the functionality of a cell, e.g., for a two bit adder: two full adder cell instances are created. Just as an instance records the instantiation (or use of) a cell block, the port instance block 105 records the instantiation of the ports on the cell. The port instances allow us to record the specific nets that are connected to a given instance.

The hierarchical nature of the information stored in the folded connectivity model is shown by way of example only in FIGS. 2A-2C. FIG. 2A depicts the highest level of hierarchy, that is cell block 200, which is a two bit adder. The two bit adder block has 8 ports (the inputs A1, B1, A0, B0, Cin; and the outputs Cout, S1, and S0). It contains the nets that are connected to these ports (A1, B1, A0, B0, Cin, Cout, S1, and S0), in addition to one internal net (Co—carry) which is not connected to a port on the cell boundary, but is none-the-less a net contained within the two bit adder cell definition. Finally, the two bit adder contains two instances, FA0 block 202 and FA1 block 203, each of which are instances of a full adder (or a one-bit adder).

FIG. 2B depicts the next lower level of the hierarchy of the system, showing the cell definition for the full adder. Note that the instances FA0 (block 202) and FA1 (block 203) in the top level (FIG. 2A) are described by a cell at the next lower level of hierarchy. The full adder block 202 has 5 ports (input ports A, B, and Cin; the output ports S and Co). It also contains 11 nets (ported nets A, B, Cin, Col and S; internal nets sig_1, sig_2, sig_3, sig_4, sig_5, and sig_6), and 8 instances (2 instances of an inverter, I1, and I2; 2 instances of a 2-input NOR gate, NO1, NO2; 2 instances of a 2-input XOR gate, XO1 and XO2; and 2 instances of a 2-input NAND gate, NA1 and NA2). Finally, FIG. 2C depicts one of the cells at the lowest level of hierarchy, the 2-input NAND gate (205). Note that there are 3 other types of cells at this same level of hierarchy that are not depicted (namely the inverter, the 2-input NOR gate, and the 2-input XOR gate). Additional levels of hierarchy may exist, e.g. a level higher than FIG. 2A and/or lower than FIG. 2C.

A folded connectivity model provides a memory efficient representation of source VLSI design data as seen by the VLSI designer. A fundamental limitation of the folded connectivity model, however, is its ability to represent a truly unique addressable object for each object created across the many levels of design hierarchy. Although this is not an issue for many existing CAD tools, it is becoming more of an issue for the next generation analysis and design tools which need to analyze design entities that span the hierarchy.

The design of FIGS. 2A-2C can be walked through to illustrate the fundamental limitation of a folded connectivity model. In these FIGURES, the top level cell FIG. 2A contains two instances of the cell "full_adder", FA0 and FA1. Each cell "full_adder" contains two instances of the block "nand_2", NA1 and NA2. This information is recorded in the folded connectivity model as shown in FIG. 4. Notice that, in this diagram, there is only one cell 406 for the NA1 and NA2 instances (blocks 415 and 405 respectively). But, when the same design in the form shown in FIG. 3 is viewed, there are in reality, two different occurrences of the instance NA1 (FA0/NA1 and FA1/NA1). The same is true for the instance NA2. The folded connectivity model only records that a single instance of cell "nand_2" named NA1 is an element of the cell "full_adder". For another example, only one set of information for the Y net will be stored in the folded model, however, each occurrence copy of the Y net is different, e.g., each copy has different delays and/or parasitic effects because, for example, of the different placement for each Y net. However, the folded model does not store these differences, and thus will not support accurate analysis of the design.

A common technique used to avoid this problem is to perform a 'flattening' process. The process of flattening a hierarchical design removes all intermediate levels of hierarchy, so only primitive elements exist. There are two primary problems with flattening. First, flattening uses a great deal of computer memory. With today's microprocessor designs, it is impossible to flatten the entire hierarchy. The second problem is that flattening is a one-way process. Once flattened, it is impossible to relate flattened circuit elements back to a hierarchical view.

For these reasons, the occurrence (or unfolded) model representation is becoming a more important representation for many of todays CAD tools. FIG. 9 represents a typical occurrence model. In an occurrence model, each and every cell is stored, including those cells that are duplicated, while retaining the notion of the original design hierarchy. The primary advantage of an occurrence model is that it allows tools to obtain the benefits of flattening (being able to see a flattened view of the design and the interconnecting nets that span hierarchy) without losing hierarchical information. In addition, using an occurrence model gives some flexibility to the tool developer, so that they do not have to build a model to represent the entire design. Instead the model represents only those pieces currently being evaluated.

For example, as shown in FIG. 3, each adder 202 and 203 is stored separately in the model, as well as each second NAND (N2) circuit 205, 208 or each adder, and each N2 transistor 207, 209 of N2 circuit. FIG. 3 depicts the multi-level view of the cell of FIG. 1 with the different levels of the example of FIGS. 2A-2C. (Note that for simplicity, the other elements of the circuit, as well as the sub-elements, e.g., I1 and I2 are not shown.) However, modern IC circuits, e.g., processors, comprise millions of instances. Thus, the size of the model quickly becomes very large as more lower levels are added to the model. Current computer systems do not have adequate memory to store the complete occurrence model. However, the lower levels are becoming more important to designers. The presence of the lower levels in the model allows for more detailed analysis of the system, e.g., analyzing parasitic loss from the net connections, which allows the designer to improve the speed and efficiency of the system.

Note that the large memory requirements of the occurrence model come not only from the storage of every instance in the design, but also from the storage of the names of each instance. For example, a typical design may include 40,000,000 P transistors, each of which requires a unique hierarchical name. For the arrangements of FIGS. 2A-2C and 3, hierarchical names for the P transistor 207 could be 2bitadd/fa0/na2/p2. Thus, as additional layers are used, the hierarchical names grow longer until they possibly exceed the size of the cells being labeled with the names.

Designers may use hash tables to store some unique occurrence information that is not stored in the folded model. Such tables are not part of the folded model and are stored separately from the model. Tables are created by the designers and include information that designer is interested in using in the analysis of the design. However, models that use these tables are not memory efficient and tend to run slow because of poor homemade designs. Also, the tables are transient. They are maintained only for the analysis of interest and then discarded. This is because each device needs its own hash table. Thus, only a small part of the design can be examined at one time. The biggest problem with homemade hash tables is that they are not reusable.

SUMMARY OF THE INVENTION

The present invention is directed to a system and method that defines a light weight folded occurrence model which includes aspects of both the folded model and the occurrence model.

The inventive lightweight occurrence model uses the arrangement of the folded model but includes occurrence nodes that are associated with the folded model. There is at least one occurrence node for each instance of an object type in the model. Each occurrence node includes occurrence specific data or a pointer to such data, a pointer to a parent/owner occurrence node, and a pointer to a folded model describer (instance net. etc.). Thus, most of the information that is present in a full occurrence model can be included in the inventive lightweight occurrence model. Since the inventive occurrence model is smaller than the full occurrence model, the entirety of complex circuit designs, e.g., microprocessors, can be represented by the inventive lightweight occurrence model. Thus, low level characteristics of the design, e.g., timing delays, can be examined.

The pointers, or other abstract interfaces, allow the information of the nodes of the folded model to be altered to include the unique data of the occurrence model instances, including its hierarchical location in the model. Thus, the entirety of the full occurrence model can be represented by the inventive lightweight occurrence model, depending upon the amount of specific data associated with the node (either stored in the node or pointed to by the node). Note that the occurrence node names do not have to be stored in the nodes. The name of the node, if needed for analysis and not stored, can be constructed from information in the inventive light weight occurrence model. Note that the occurrence nodes do not store information that is already present in the folded model, e.g., information on child nodes and/or information about the relationships of ports, cells, and nets. Consequently, the memory required for the inventive lightweight occurrence model is significantly less than that required for the full occurrence model. For example, an inventive node storing only three pointers may require 12 bytes, while a full occurrence node may require 40 or more bytes, meaning that the inventive lightweight occurrence model would only require about 30% of the memory required for the full occurrence model.

Another aspect of the present invention is that the lightweight occurrence model may be controlled by a user. The user may control the model so that only a desired level of hierarchy for a desired portion of the model is created. In the prior art, the full occurrence model forces the folded model to be unfolded to the lowest level of the model. Note that this allows the model to have more detailed (lower level) information stored for a particular portion, while having less detailed (higher level) information stored for the remainder of the model. This allows a partial tree to be used, with some branches having more detailed information than other branches.

Alternatively, the user may have a choice of creating an occurrence tree that only contains 1) occurrence node for instance, 2) occurrence node for instance and net, or 3) occurrence node for instance, net and port instance etc. so that based upon what kind of information the user is interested in, the user may have the total control of what size of the occurrence tree he may want to create.

As stated above, the occurrence node names do not have to be stored in the nodes. However, the model needs to work with tools that require node names for performing analysis on the designs that use the model. Typically, the analysis is a hierarchical-based analysis, and hierarchical names are required. However, in the invention, the names of the nodes can be constructed from information in the inventive lightweight occurrence model, e.g., the owner node pointers, the folded instance pointers, etc. This is one of the ways that the inventive lightweight occurrence model appears to the user to be a full occurrence model.

The inventive lightweight occurrence model maintains the occurrence specific information in a more permanent and organized manner than that of the prior art. The hash tables used by the prior art are external from the model. The hash tables are also written by a designer for their own use and are discarded when that use is finished. Information needed at a subsequent time and/or by a different designer is rewritten into a new hash table. Consequently, the use of hash tables results in error-prone and inconsistent analysis. Thus, the specific information for the inventive model needs only to be written once and is maintained with the inventive model.

The foregoing has outlined rather broadly the features and technical advantages of the present invention in order that the detailed description of the invention that follows may be better understood. Additional features and advantages of the invention will be described hereinafter which form the subject of the claim of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 5:
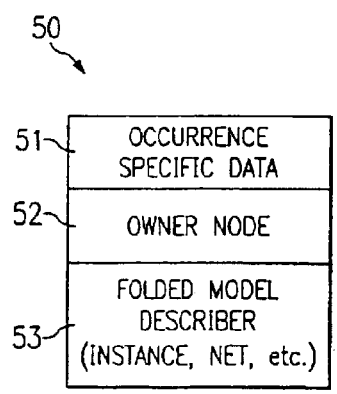
FIG. 5 depicts a schematic illustration of an inventive occurrence node.

FIG. 5 depicts an example of a occurrence node 50 that provides the occurrence specific information and is associated with an occurrence object of the folded model. There would be at least one occurrence node for each net, cell instance and port instance for each of the cells, ports and net blocks of a folded model. For example, using the folded connectivity model of the prior art, there would be an occurrence node for each full adder instance of the full adder cell as well as for the nets, ports and port instances of the cell. There would be two occurrence nodes for each NAND instance of the NAND cell as well as for the nets, etc. of the cell.

Figure 3:
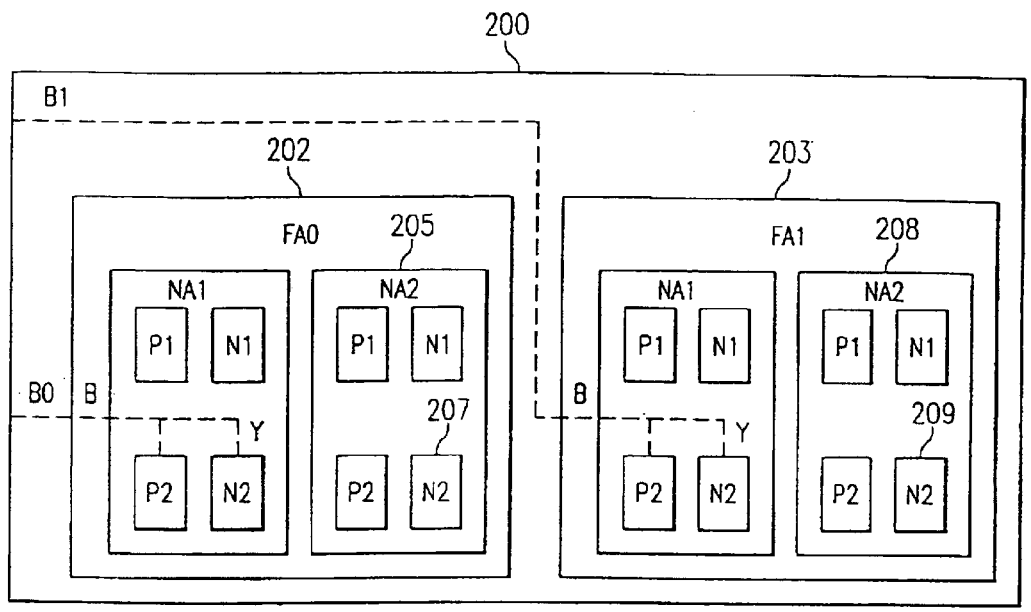
FIG. 3 depicts a graphical representation of the full occurrence model of the example of FIGS. 2A-2C.

Each node includes occurrence specific data 51. This data may be the information that is used to make the occurrence unique, e.g. net timing delay, resistance, capacitance, power grid, simulation testing values. For example, FIG. 3 includes two Y nets, one in FA0 and the other in FA1. However, nets B0 and B1 are of different lengths, thus the timing characteristics for each Y net will be different. The corresponding unique timing delay information may be stored in the respective occurrence nodes (2_bit_add/FA0/NA1/Y, 2_bit_add/FA0/NA2/Y, 2_bit_add/FA1/NA1/Y, and 2_bit_add/FA1/NA2/Y).

Each node 50 includes an Owner node pointer 52. This pointer 52 arranges the occurrence nodes in a hierarchical format by pointing to a preceding occurrence instance node in the hierarchy of nodes as defined by the folded model. This allows for the inventive model to be traversed from a child to parent direction. In the prior art folded model, once at a lower level cell, e.g., a full adder cell, there was no information that would indicate from which instance the analysis originated. Thus, the prior art model could not be traversed from a lower level to higher level (child to parent) direction, i.e., the prior art model could only be traversed from the higher level to lower level (parent to child) direction. Note that since each node will have only one Owner node, it is preferable to maintain information about the parent. It is less desirable to maintain information about the children of a particular node, since each node could have many children, with each node having a different number of children. A null pointer is used in the Owner pointer 52 to indicate that the node 50 is the highest node in the hierarchy.

Each node 50 also includes a folded model describer pointer 53. This pointer 53 points to the instance, net or port instance to which the node 50 is associated in the folded model. This allows analysis of the model to not duplicate information that is already stored in the folded model for each occurrence node.

Figure 6A:
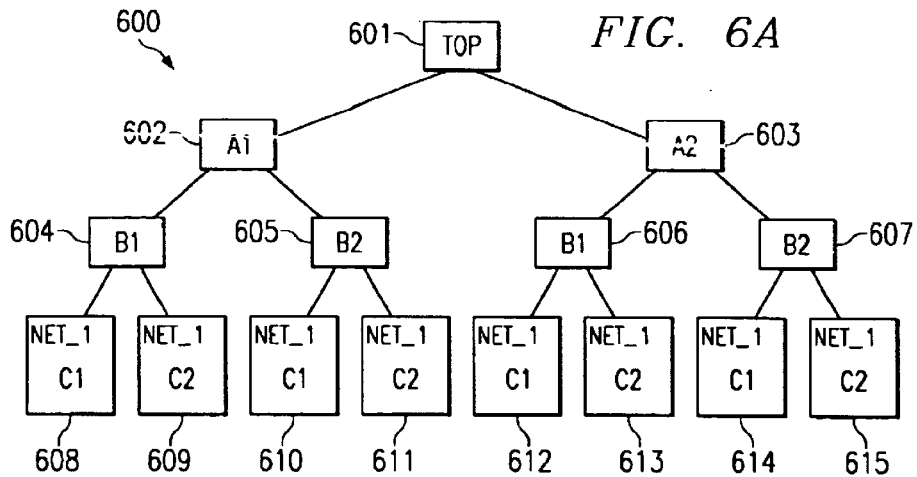
FIG. 6A depicts a example of a hierarchical cell arrangement or tree used in describing the inventive model.

FIG. 6A depicts an example of a hierarchical cell arrangement or tree 600 that will be used in describing the inventive model. Note that the port and net hierarchies are not shown for simplicity, but would be present in a model. The highest level cell is the top cell 601, which has two instances of cell type A, namely A1 602 and A2 603. Each of these instances includes two instances of cell type B, namely B1 604 and B2 605 for A1 602, and B1 606 and B2 607 for A2 603. Each of these instances includes two instances of cell type C, namely C1 608 and C2 609 for B1 604, C1 610 and C2 611 for B2 605, C1 612 and C2 613 for B1 606, and C1 614 and C2 615 for B2 607.

Figure 1:
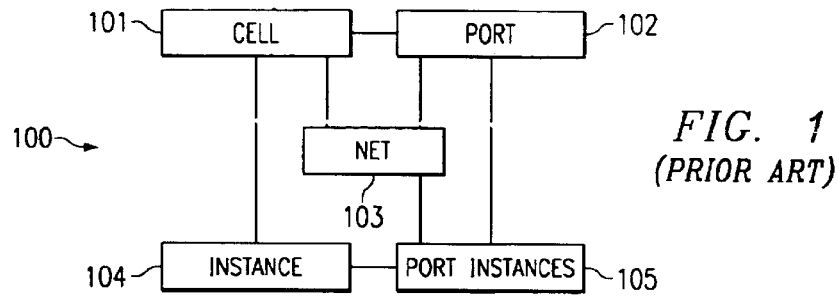
FIG. 1 depicts a schematic illustration of a full occurrence model of the prior art.
Figure 2A:
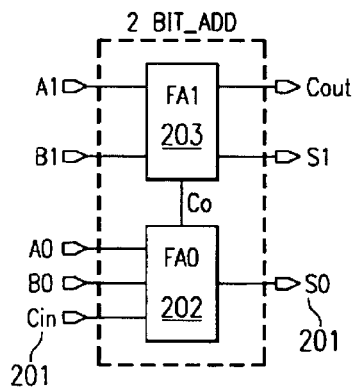
FIGS. 2A-2C depict a graphical representation of the hierarchical information in a full occurrence model of the prior art.
Figure 2C:
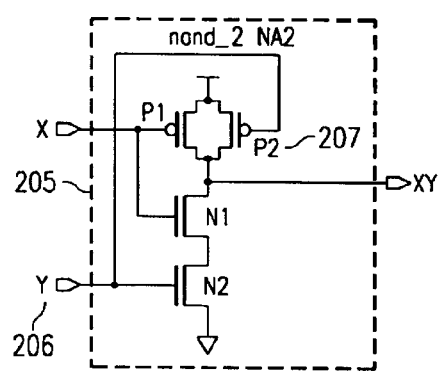
Figure 2B:
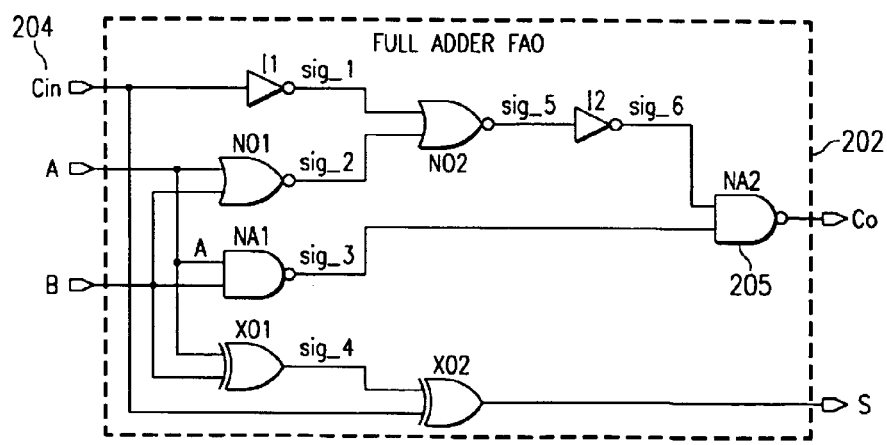
Figure 6B:
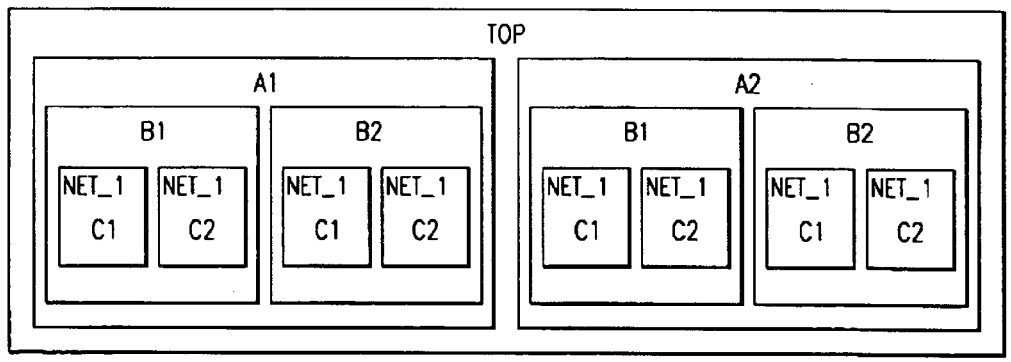
FIG. 6B depicts an output graph that would be displayed to a user based on the tree of FIG. 6A.
Figure 8A:
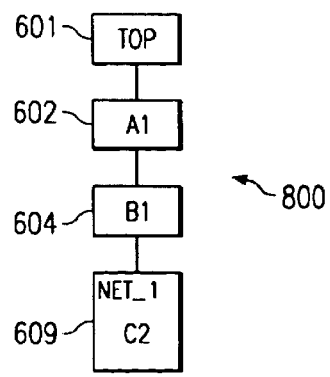
FIG. 8A depicts another example of a hierarchical cell arrangement or tree used in describing the inventive model.
Figure 8B:
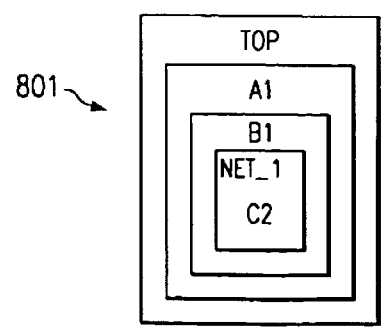
FIG. 8B depicts an output graph that would be displayed to a user based on the tree of FIG. 8A.
Figure 7:
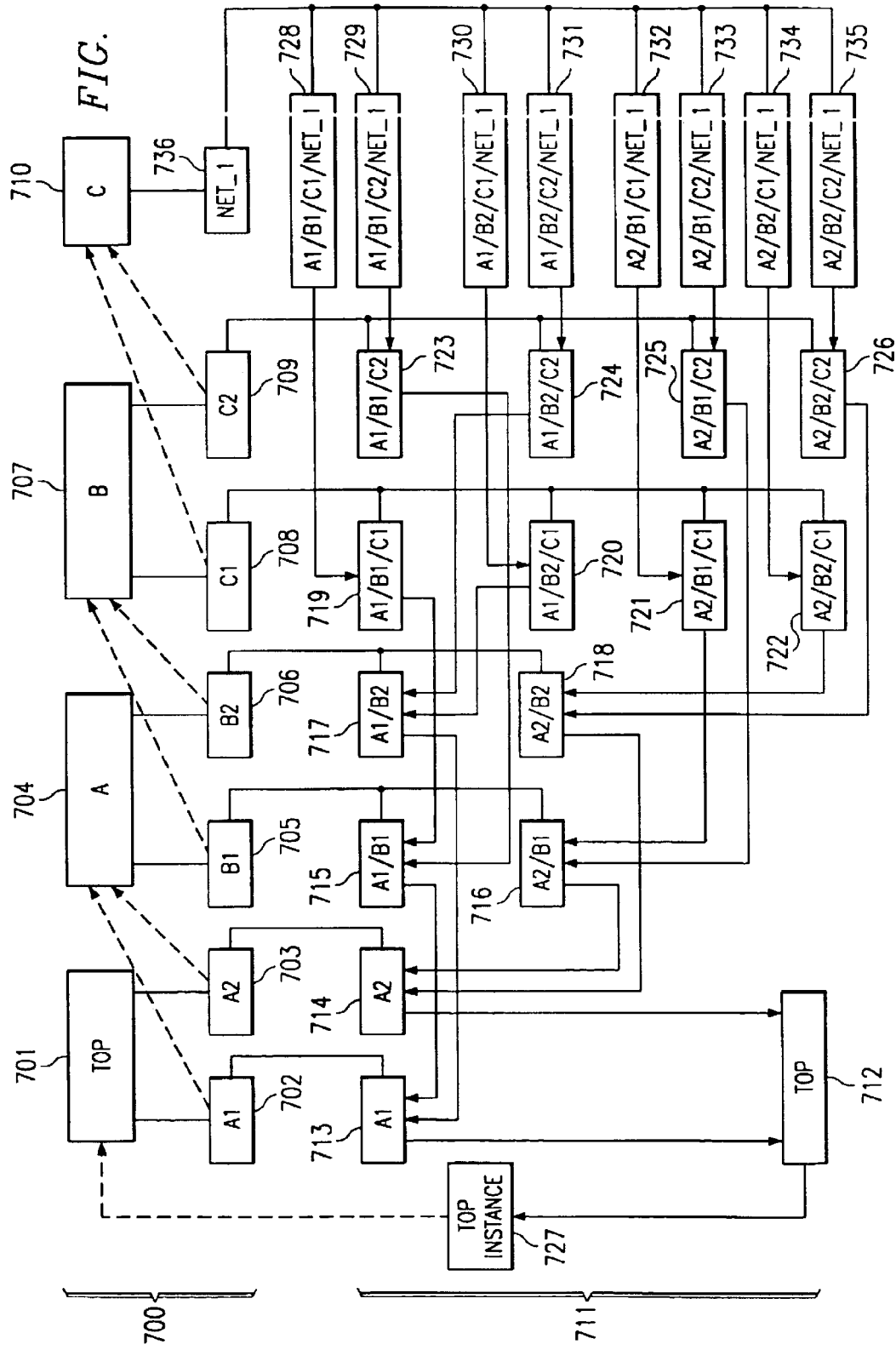
FIG. 7 depicts a schematic illustration of the inventive model.
Figure 9:
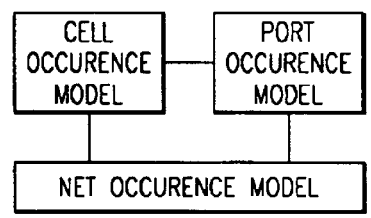
FIG. 9 depict a graphical representation of an occurrence model.

In the exemplary models illustrated in FIGS. 6, 7 and 8, each instance of cell type C includes net information, designated Net_1. In order to simplify the drawings, only Net_1 is shown, although each instance may include many nets. Net_1 corresponds to element 103 of FIG. 1. For example, in FIG. 3, lines B0 and B1 are illustrated. Line B1, the path to FA1/NA1/Y, is longer than line B0, the path to FA0/NA1/Y. As a result, FA1/NA1/Y has a longer delay than FA0/NA1/Y. The occurrence net, Net_1, allows the designer to account for such delays when analyzing the circuit. The prior art folded model could not account for such individual net parameters.

Figure 4:
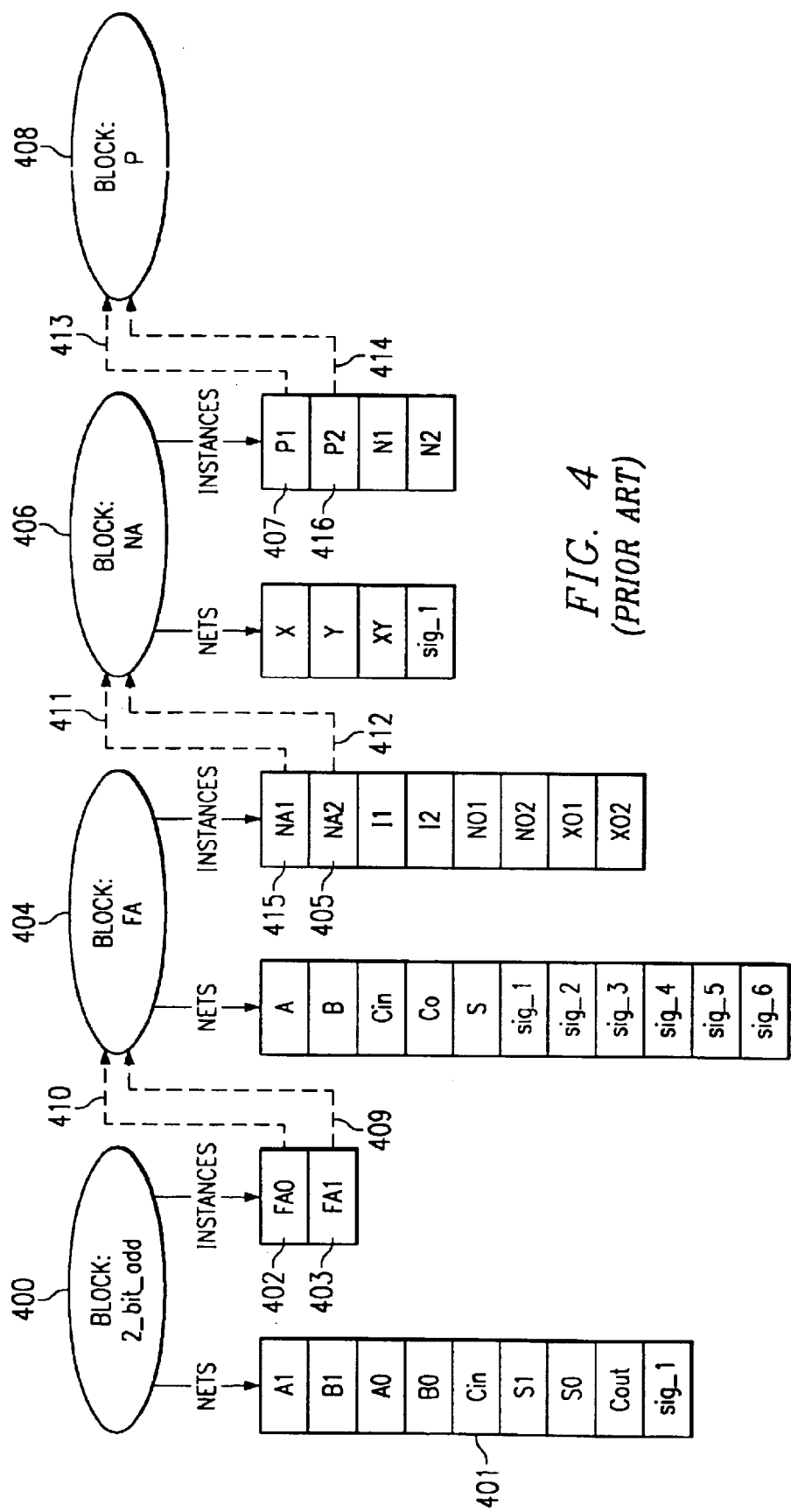
FIG. 4 depicts a schematic illustration of a folded connectivity model of the prior art using the example of FIGS. 2A-2C.

FIG. 7 depicts the inventive lightweight folded model view of the tree 600 of FIG. 6A. Portion 700 depicts the folded model of the tree 600. Note that this portion would be similar to prior art FIG. 4. The highest level cell is the top cell 701, which has two instances of cell type A, namely A1 702 and A2 703. Each of these "A" instances points to and is described by cell A 704, which includes two instances of cell type B, namely B1 705 and B2 706. Each of these "B" instances points to and is described by cell B 707, which includes two instances of cell type C, namely C1 708 and C2 709. Each of these "C" instances points to and is described by cell C 710. Note that the occurrence model would store four separate versions of the C1 node as 719, 720, 721 and 722 as occurrence nodes of instance C1 708. Using node 719 as an example, its Owner node pointer (52) points to 715 and its Folded Model Describer pointer (53) points to 708. Finally, the 719 node itself has a pointer (51) to allow the user to store the occurrence specific data (string, int, float ) for itself.

Portion 711 of FIG. 7 depicts a plurality of occurrence nodes, each of which is associated with a particular instance of cell types of portion 700. Top occurrence node 712 is the occurrence node associated with the cell 701. The Owner node pointer 52 of this node 712 would contain the null pointer to indicate that it is the highest node. The folded model describer pointer (53) points to the top instance 727, which points to the top cell 701. This instance a is dummy instance to allow the model to properly operate, i.e. the top cell would normally not have an instance, so that node 712 can point to an instance. The occurrence specific data field could include either specific data about the occurrence of the cell instance or a pointer to such specific data, or both data and a pointer to additional data.

The tree includes two instances of cell type A, and thus there are two corresponding nodes, A1 713 and A2 714. The Owner node pointer (52) of nodes 713, 714 would contain a pointer to node 712, which indicates that both nodes are children of parent node 712. The folded model describer pointers (53) of node 713, 714 point to the A1 instance 702 and the A2 instance 703, respectively. The occurrence specific data fields could include either specific data about the occurrence of the cell instance or a pointer to such specific data, or both data and a pointer to additional data.

The tree includes four instances of cell type B, and thus there are four corresponding nodes, A1/B1 715, A2/B1 716, A1/B2 717, and A2/B2 718. The Owner node pointers (52) of nodes A1/B1 715 and A1/B2 717 would both contain a pointer to A1 node 713, which indicates that both nodes are children of parent node 713. Similarly, the Owner node pointer (52) of nodes A2/B1 716 and A2/B2 718 would both contain a pointer to A2 node 714, which indicates that both nodes are children of parent node 714. The folded model describer pointers (53) of each node 715 and 716 point to the B1 instance 705. Similarly, the folded model describer pointers (53) of each node 717 and 718 point to the B2 instance 706. The occurrence specific data fields could include either specific data about the occurrence of the cell instance or a pointer to such specific data, or both data and a pointer to additional data.

The tree includes eight instances of cell type C, and thus there are eight corresponding nodes, A1/B1/C1 719, A1/B2/C1 720, A2/B1/C1 721, A2/B2/C1 722, A1/B1/C2 723, A1/B2/C2 724, A2/B1/C2 725, and A2/B2/C2 726. The Owner node pointer (52) of nodes A1/B1/C1 719 and A1/B1/C2 723 would both contain a pointer to A1/B1 node 715, which indicates that both nodes are children of parent node 715. Similarly, the Owner node pointer (52) of nodes A2/B1/C1 721 and A2/B1/C2 725 would both contain a pointer to A2/B1 node 716, which indicates that both nodes are children of parent node 716. Similarly, the Owner node pointer (52) of nodes A1/B2/C1 720 and A1/B2/C2 725 would both contain a pointer to A1/B2 node 717, which indicates that both nodes are children of parent node 717. Similarly, the Owner node pointer (52) of nodes A2/B2/C1 722 and A1/B2/C2 726 would both contain a pointer to A2/B2 node 718, which indicates that both nodes are children of parent node 718. The folded model describer pointer (53) of each nodes 719, 720, 721, and 722 points to the C1 instance 708. Similarly, the folded model describer pointer (53) of each node 723, 724, 725 and 726 points to the C2 instance 709. Note that all the occurrence nodes are physically contained in C1 708 for 719, 720, 721 and 722, and all the occurrence nodes are physically contained in C2 709 for 723, 724, 725 and 726. Since Owner node pointer (52) of each occurrence node is different, one can distinguish the nodes within the 708 or 709 folded model. The occurrence specific data fields could include either specific data about the occurrence of the cell instance or a pointer to such specific data, or both data and a pointer to additional data.

Net_1 736 is associated with cell "C" 710 in the folded model. Net_1 represents a net within cell of type "C." Each occurrence of type "C" has Net_1 information, however, the Net_1 data varies for each individual occurrence, because, for example, the line lengths and timing delays vary for each occurrence. Net_1 occurrences 728–735 represent the net information for the individual occurrences 719–726. By accounting for the timing delay and other net parameters in each individual occurrence, designers are able to analyze factors, such as critical path, using the lightweight folded model that cannot be analyzed in the prior art folded model.

Note that the names of the occurrence nodes do not have to be stored with the occurrence nodes. Also note that the names do not include the tag for the top node for simplicity, e.g., the name for node 715 could be TOP/A1/B1. If the node names are not stored in the nodes, then the names can be constructed from information in the inventive light weight occurrence model. The following is one example of how the names can be constructed. Occurrence node 719 may follow its pointer (53) to 708 to gets its name "C1." Then it follows its Owner pointer (52) to 715 to get the name "B1" and adds "B1" in front of "C1." This process is repeated recursively until reaching top occurrence node 712 for which the Owner pointer (52) is NULL. At this point, the full constructed hierarchy name string is returned to the user as "Top/A1/B1/C1." This (Construction is done in a constant time performance. Also note that this is an example of how the model is traversed from the lower level to the upper level, which is not possible using the prior art folded model.

Traversing from the upper level to the lower levels, or given a parent node and trying to find a specific occurrence node at the lower level, will be more complicated since there is no pointer in the occurrence node 50 to point to the lower level occurrence node(s). On the other hand, to traverse from the lower level to the upper level one can follow the Owner pointer (52) to go to the upper occurrence node directly. The following is an example of how to get from occurrence node 718 to occurrence node 722. There are four occurrence nodes in C1 (708), we have to search the occurrence node container in C1 (708) to find node 722. However, the number of occurrence node in an instance or net in the folded model could be very huge, thousands of occurrence node could be contained with in one instance of folded model, a linear searching for the lower level occurrence node could become the bottle neck and too slow. This would prevent the lightweight occurrence model from being used by a designer. However, Owner pointer (52) in the occurrence node not only provides a path to the upper level occurrence node, but also provides a unique searching key in the lower level to find a specific occurrence node very quickly. For instance, referring to the occurrence nodes 719, 720, 721, and 722 in instance C1, the Owner pointers (52) in the occurrence nodes are different from each other and can be used as a searching key. Because of this, a Standard Template Library (STL) sorted associative container, such as "map," can be used and O(log N) performance can be achieved for retrieving any desired occurrence node at the lower level or for traversing from upper level occurrence node to the lower level occurrence node. This performance makes the lightweight occurrence model be really usable.

FIG. 6B depicts on output graph 616 that is displayed to a user based on the tree of FIG. 6A. Each node of the tree 600 is depicted in a graphical format that shows the hierarchical arrangement of the nodes in the tree. The inventive model can allow the user to only create the occurrence node that the user desires. For example, suppose the user or designer is only interested in node TOP/A1/B2/C2 609, which could be displayed as shown by the graph 801 of FIG. 8B. Thus, the other elements of the full graph shown in FIG. 6B are not required. In order to provide the graph 801 of FIG. 8B, a minimal amount of information is required. This is shown by the tree 800 of FIG. 8A. In order to allow analysis of node 609, nodes 604, 602, and 601 must be present. The remaining nodes are unnecessary. Note that some or all of the other nodes of FIG. 6A could be present in the tree 800, but are not required.

A user may create an occurrence tree with occurrence instance nodes only, or with occurrence instance and occurrence net etc. based upon the type of information that he is interested in analyzing. For example, the user may interested in timing delay information, so he may create the tree that not only includes occurrence instance, but also include occurrence net. In FIG. 7 elements 728–736 show the occurrence nets and their relation to net in the folded model and their relation to occurrence instance. Net_1 736 is a net in the folded model. When a user creates a occurrence of "C" an occurrence net will be created as well. Accordingly, eight corresponding occurrence nets (728–735) are created for occurrences 719–726. Each of the occurrence nets corresponds to node 50 in FIG. 5. For example, for node 728, a field 51 will give the user a storage to store such as timing delay data etc.; a field 52 will point to node 719 as the owner and searching key of this specific occurrence net; and a field 53 will point to node 736 as the describer of the occurrence net and from there it can get the common information of the net that are not stored in the occurrence node.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may included any signal that can propagate over a transmission medium such as electronic network channels, optical fibers, air, electromagnetic, RF links, etc. The code segments may be downloaded via computer networks such as the Internet, Intranet, etc.

Figure 10:
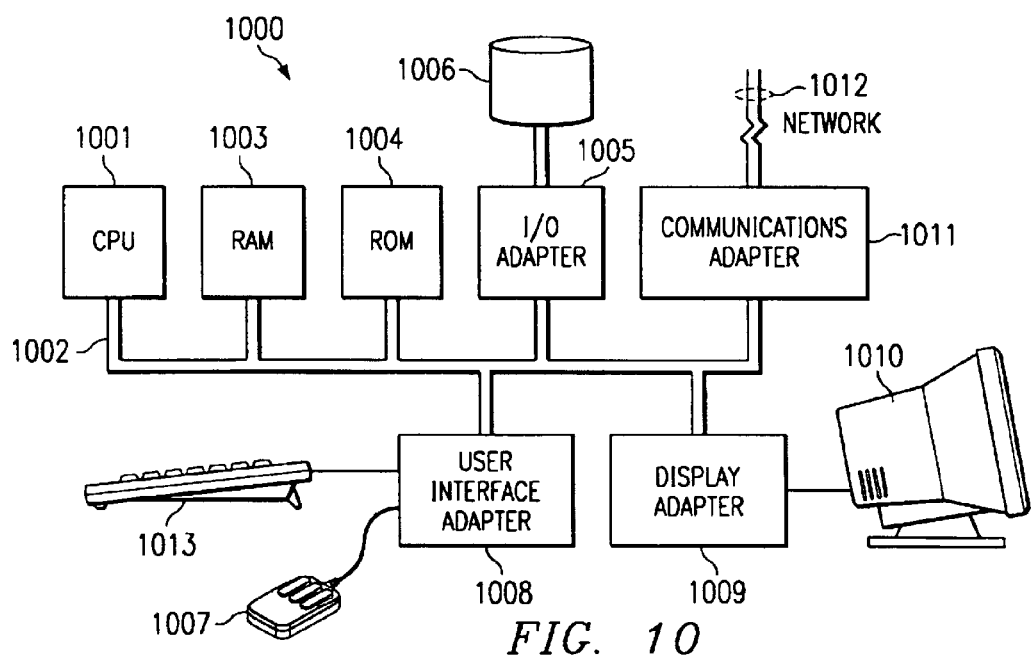
FIG. 10 depicts a block diagram of a computer system which is adapted to use the present invention.

FIG. 10 illustrates computer system 1000 adapted to use the present invention. Central processing unit (CPU) 1001 is coupled to system bus 1002. The CPU 1001 may be any general purpose CPU, such as an HP PA-8500 or Intel Pentium processor. However, the present invention is not restricted by the architecture of CPU 1001 as long as CPU 1001 supports the inventive operations as described herein. Bus 1002 is coupled to random access memory (RAM) 1003, which may be SRAM, DRAM, or SDRAM. ROM 1004 is also coupled to bus 1002, which may be PROM, EPROM, or EEPROM. RAM 1003 and ROM 1004 hold user and system data and programs as is well known in the art.

Bus 1002 is also coupled to input/output (I/O) controller card 1005, communications adapter card 1011, user interface card 1008, and display card 1009. The I/O card 1005 connects to storage devices 1006, such as one or more of hard drive, CD drive, floppy disk drive, tape drive, to the computer system. Communications card 1011 is adapted to couple the computer system 1000 to a network 1012, which may be one or more of telephone network, local (LAN) and/or wide-area (WAN) network, Ethernet network, and/or Internet network. User interface card 1008 couples user input devices, such as keyboard 1013 and pointing device 1007, to the computer system 1000. The display card 1009 is driven by CPU 1001 to control the display on display device 1010.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for modeling a system design comprising the steps of:
    defining at least one cell that identifies a collection of elements constituting a device;
    defining one or more instances of said at least one cell within the system using a folded circuit model;
    defining occurrence nodes for each of said one or more instances, wherein said occurrence nodes are arranged in one or more hierarchical levels; and
    associating the occurrence nodes with the one or more instances.

2. The method of claim 1 wherein each occurrence node comprises specific occurrence data for that occurrence node.

3. The method of claim 1 wherein each occurrence node comprises owner pointer information that indicates a specific occurrence node in a previous level.

4. The method of claim 3 wherein said owner pointer information operates as a search key that allows O(log N) search performance.

5. The method of claim 3 further comprising:
    searching said occurrence nodes using said owner pointer information.

6. The method of claim 3 wherein said pointer information for a top level occurrence node is a null pointer.

7. The method of claim 1 wherein each occurrence node comprises describer pointer information that points to information in said folded model that is common to a plurality of the occurrence nodes.

8. The method of claim 1 further comprising the steps of:
    defining occurrence specific data for each occurrence node;
    defining an owner pointer for each occurrence node, wherein the owner pointer indicates a specific occurrence node in a previous level; and defining a describer pointer for each occurrence node, wherein said describer pointer points to an instance that is used to describe the occurrence node.

9. The method of claim 1 further comprising the step of:

defining net occurrences for each of said occurrence nodes; and defining describer pointers for each net occurrence node, wherein said describer pointer points to a net that is used to described the occurrence node.

10. The method of claim 1 wherein users define a portion of the system by defining a number of cells, instances and occurrence nodes that are less than the total number of cells, instances and occurrence nodes.

11. A method for defining and analyzing a system that is defined by a folded model comprising cells and instances, the method comprising the steps of:

defining occurrence nodes arranged in hierarchical levels, wherein each occurrence node identifies a corresponding instance in said folded model; and specifying a pointer for each of said occurrence nodes, wherein the pointer points to a specific occurrence node in another level.

12. The method of claim 11 further comprising:

assigning a top level occurrence node a null pointer to indicate it is the top level node.

13. The method of claim 11 wherein said pointer allows users to search both up and down the hierarchical levels with a O(log N) performance.

14. The method of claim 13 further comprising the step of:

searching said occurrence nodes using the pointer as a search key.

15. The method of claim 14 wherein the searching step further comprises:

searching with a map container of a Standard Template Library.

16. A method for providing occurrence nodes for a circuit model comprising the steps of:

specifying data that is specific to each of said occurrence nodes;

specifying owner pointers for each of said occurrence nodes, wherein said owner pointers point to a occurrence node in a different level in a hierarchy of levels; and specifying describer pointers for each of said occurrence nodes, wherein said describer pointers point to instances of a folded circuit model that are associated with cells that define circuit elements of said occurrence nodes.

17. The method of claim 16 further comprising:

specifying only a portion of the total number of occurrence nodes that are required to define an entire system.

18. The method of claim 17 wherein the specified portion of occurrence nodes are those occurrence nodes that are required to analyze a selected part of the system.

19. The method of claim 16 further comprising the step of:

storing the specified data and pointers in the folded circuit model.

20. The method of claim 16 wherein said owner pointer can be searched to identify specific occurrence nodes both up and down in the hierarchy of levels.

21. A method for designing a circuit, comprising:

defining a folded model of said circuit, wherein said folded model represents said circuit as a linked structure of cells and instances of the cells, wherein each cell defines a respective collection of elements constituting a device and the linked structure is constructed such that each instance of the same cell points to the same cell; and defining occurrence nodes to provide data members for storing circuit information unique to the corresponding instances of the folded model, wherein each occurrence node identifies a corresponding instance of said folded model and identifies an owner occurrence node in a previous hierarchical level.

22. The method of claim 21 wherein an occurrence node located at a highest level of said circuit includes a NULL value for an identification of its owner occurrence node.

23. The method of claim 21 wherein said occurrence nodes do not store information identifying collections of elements associated with the devices of said occurrence nodes.

24. The method of claim 21 wherein said occurrence nodes do not store information identifying child nodes within said occurrence model.

25. The method of claim 21 wherein said occurrence nodes do not store naming information that uniquely identifies said occurrence nodes.

26. The method of claim 25 further comprising:

constructing a unique identifier for a selected occurrence node by traversing hierarchical levels of said occurrence nodes using identifications of owner occurrence nodes.

27. The method of claim 21 further comprising:

conducting a search for a selected occurrence node by using an identifier of the selected occurrence node's owner as a search key.

* * * * *